(12) United States Patent
Rizzo et al.

(10) Patent No.: US 11,366,144 B2
(45) Date of Patent: Jun. 21, 2022

(54) METHOD AND DEVICE FOR CURRENT AND VOLTAGE MEASUREMENT

(71) Applicant: Hitachi Energy Switzerland AG, Baden (CH)

(72) Inventors: Francesco Rizzo, Urdorf (CH); Calogero Bona, Oberrohrdorf (CH)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/433,179

(22) PCT Filed: Feb. 24, 2020

(86) PCT No.: PCT/EP2020/054762
§ 371 (c)(1),
(2) Date: Aug. 23, 2021

(87) PCT Pub. No.: WO2020/173871
PCT Pub. Date: Sep. 3, 2020

(65) Prior Publication Data
US 2022/0043039 A1    Feb. 10, 2022

(30) Foreign Application Priority Data
Feb. 25, 2019  (EP) ..................................... 19158992

(51) Int. Cl.
*G01R 19/25* (2006.01)
*G01R 15/08* (2006.01)
(Continued)

(52) U.S. Cl.
CPC ......... *G01R 19/2513* (2013.01); *G01R 15/08* (2013.01); *H03M 1/185* (2013.01); *G01R 22/10* (2013.01)

(58) Field of Classification Search
CPC .... G01R 19/2513; G01R 15/08; G01R 22/10; H03M 1/185
(Continued)

(56) References Cited

U.S. PATENT DOCUMENTS 5,296,792 A * 3/1994 Knierim .................... H02P 7/04
                                                 318/400.4
6,433,723 B1   8/2002 Randall
(Continued)

FOREIGN PATENT DOCUMENTS

CN    1934787 A      3/2007
CN    102262172 A   11/2011
(Continued)

OTHER PUBLICATIONS

Slattery, Colm, et al., "Oversampled ADC and PGA Combine to Provide 127-dB Dynamic Range", Analog Dialogue 45-12, Dec. 2011, 5 pages.
(Continued)

*Primary Examiner* — John H Le
(74) *Attorney, Agent, or Firm* — Slater Matsil, LLP

(57) ABSTRACT

The present invention relates to a device and a method for measurement of electrical signals in an industrial automation and control system. The device comprises an input circuit, configured to receive an electrical input signal (100), scale the electrical input signal by a scaling factor and to set the scaling factor according to a scaling signal (110), an Analog-to-Digital Converter, ADC (220), which is electrically connected to the input circuit, wherein the ADC is configured to convert the scaled electrical input signal (103) into an intermediate digital signal (120), and a first signal path (211), connected to an digital end of the ADC, configured to create the scaling signal (110) and to send the scaling signal (110) to the input circuit, wherein, based on the intermediate
(Continued)

digital signal of a sample period and the scaling factor of the sample period, the scaling factor for a subsequent sample period is set.

20 Claims, 3 Drawing Sheets

(51) Int. Cl.
*H03M 1/18* (2006.01)
*G01R 22/10* (2006.01)

(58) Field of Classification Search
USPC .......................................................... 702/64
See application file for complete search history.

(56) References Cited

U.S. PATENT DOCUMENTS

| | | | |
|---|---|---|---|
| 6,822,595 B1 | 11/2004 | Robinson | |
| 6,940,445 B2 | 9/2005 | Kearney | |
| 7,405,683 B1 | 7/2008 | Perrin et al. | |
| 8,212,699 B1 | 7/2012 | Nilsson et al. | |
| 8,666,688 B2* | 3/2014 | Spanier .............. | G01R 19/2509 702/69 |
| 9,304,152 B2 | 4/2016 | Aerts | |
| 10,361,710 B2* | 7/2019 | Lin ....................... | H04B 1/401 |
| 2003/0215032 A1 | 11/2003 | Langlais et al. | |
| 2006/0290556 A1 | 12/2006 | Sherry et al. | |
| 2007/0067119 A1 | 3/2007 | Loewen et al. | |
| 2009/0096654 A1* | 4/2009 | Zhu ..................... | H03M 1/0682 341/155 |
| 2009/0121908 A1 | 5/2009 | Regier | |
| 2011/0085800 A1 | 4/2011 | Cerisola et al. | |
| 2011/0231157 A1 | 9/2011 | Alley et al. | |
| 2013/0027022 A1 | 1/2013 | Woelfel et al. | |
| 2017/0212721 A1 | 7/2017 | Satoskar et al. | |
| 2018/0031617 A1 | 2/2018 | Rieken et al. | |
| 2018/0284159 A1* | 10/2018 | Callanan ............ | G01R 19/2506 |
| 2020/0186098 A1* | 6/2020 | Basilico ................. | H03F 1/086 |

FOREIGN PATENT DOCUMENTS

| | | |
|---|---|---|
| FR | 2708161 A1 | 1/1995 |
| JP | 2005109599 A | 4/2005 |
| JP | 2008193744 A | 8/2008 |

OTHER PUBLICATIONS

Notice of Grounds of Rejection from related Japanese application No. 2021-549707, dated Jan. 4, 2022, 6 pages.

* cited by examiner

METHOD AND DEVICE FOR CURRENT AND VOLTAGE MEASUREMENT

CROSS-REFERENCE TO RELATED APPLICATIONS

This application is a national stage application of International Application No. PCT/EP2020/054762, filed on Feb. 24, 2020, which claims priority to European Patent Application No. 19158992.8, filed on Feb. 25, 2019, which applications are hereby incorporated herein by reference.

FIELD OF THE INVENTION

The present invention relates to the field of current and/or voltage measurement in an industrial automation and control system, in particular in a substation or power grid automation system. In particular, the present invention relates to a device and a method for current and/or voltage measurement in such a system.

BACKGROUND OF THE INVENTION

Measurement of electrical signals such as current and/or voltage is an important task in an industrial automation and control system, in particular in a substation or power grid automation system. Often in substation or power grid automation systems, the secondary current or voltage of a primary instrument transformer is measured by a device such as an Intelligent Electronic Device, IED, e.g., a digital relay, a merging unit, a process level device, or a phasor measurement unit. The measured signals are used for control, metering, as well as protection applications. Hence, the measurand can range from a fraction of a nominal current or voltage level to fault currents and fault voltages at high multiples of the nominal level. Accordingly, the measurement devices require a high dynamic range. This is achieved in prior art by several hardware paths in the device adapted for different measurand ranges. Obviously, this requires more hardware components and adds to the cost of the device.

DESCRIPTION OF THE INVENTION

It is an objective of the present invention to provide a device and a method for current and/or voltage measurement in an industrial automation and control system, in particular in a substation or power grid automation system, with a high dynamic range in a single input channel. An input channel comprises an input circuit, which mainly comprises analog electronic components, an Analog-to-Digital Converter, ADC, and a digital part. In a number of applications in substation and power grid automation to improve the measurement quality as well as the device and operator safety, the input circuit and an analog end of the ADC may be galvanically isolated from the digital part of the input channel. ADCs available with galvanic separation may not be available with sufficiently high bit rates or dynamic range to cover the required measurand range in a single input channel, i.e., the may have in itself a low dynamic range, increasing the need of the present invention for these applications. Furthermore, solutions employing different input channels for different measurand ranges become even more expensive when galvanic isolation is required. In addition, the method and the device have to comply with requirements for protection applications wherein nearly instantaneous overcurrent signals and waveform artefacts have to be measured. Furthermore, the present invention can be carried out with relatively inexpensive electronic components as an ADC with a low dynamic range and, in addition to ADC and a digital signal processor or the like, with simple discrete components such as switches and resistors, in particular, it can be carried without any integrated adjustable gain amplifier.

These objectives are achieved by the subject-matter of the independent claims. Further exemplary embodiments are evident from the dependent claims and the following description.

A first aspect of the present invention relates to a device for current and/or voltage measurement in an industrial control and automation system, in particular a substation or power grid automation system. This device comprises an input circuit, configured to receive an electrical input signal, in particular an analog electrical signal, to scale the electrical input signal by a scaling factor, to receive a scaling signal, and to set the scaling factor according to the scaling signal to at least a first or a second value. The device further comprises an ADC, in particular a delta-sigma ADC, having an analog end, the analog end being electrically connected to the input circuit, and a digital end; the ADC is configured to convert the scaled electrical input signal into an intermediate digital signal and to output the intermediate digital signal at the digital end. The device further comprises a first signal path, e.g., a feedback loop, wherein the first signal path is connected to the digital end of the ADC and is configured to create the scaling signal and to send the scaling signal to the input circuit. Herein, the device is configured to set, based, in particular based only, on the intermediate digital signal of a sample period or of a clock cycle and the scaling factor of the sample period or of the clock cycle, in particular during the sample period or clock cycle, the scaling factor for a subsequent sample period or for a subsequent clock cycle. Herein, the sample period or the clock cycle may be the sample period or the clock cycle of the first signal path; the subsequent sample period or clock cycle may be the subsequent sample period or clock cycle of the first signal path.

The device may further comprise a second signal path that is connected to the digital end of the ADC and is configured to create a refined digital signal from the intermediate digital signal using the scaling factor, wherein the second signal path has a second sampling rate, e.g., 1 kS/s to 200 kS/s, in particular 20 kS/s and the first signal path has a first sampling rate higher than the second sampling rate, in particular by at least a factor of 2, 5, or 10, e.g., 10 kS/s to 2000 kS/s, in particular 500 kS/s. The second signal path may be further configured to output the refined digital signal for further processing such as for outputting to a user interface, for creation of time-critical messages and/or sampled value messages, for creation of phasor data, for revenue metering, and/or as input of protection functions. The first signal path may be further configured to send the scaling signal or an indication of the scaling factor to the second signal path. The second signal may further be configured to receive the scaling signal or the indication of the scaling signal.

In embodiments, the first signal path may be further configured to create an auxiliary digital signal from the intermediate digital signal, in particular using the scaling factor. This may be achieved, e.g., by division of the intermediate digital signal by the scaling factor, and possible further multiplication with correction factors and/or application of one or more filters, and in particular without using a temporal change and/or a slew rate of the intermediate digital signal; e.g., the auxiliary digital signal may not be a predicted or forecasted value for the electrical input signal for a subsequent sample period. The device may be configured to set the scaling factor for the subsequent sample period by comparing the auxiliary digital signal of the sample period with at least one threshold. In embodiments, the at least one threshold may depend on the scaling factor of the sample period.

The ADC, the first signal path, the second signal path, and/or the device may be configured to operate in a clocked manner.

By way of example, the scaling factor may have at least a first value or a second value with the second value being larger than the first value. In this case, the device may be configured to conduct the comparison of the auxiliary digital signal of the sample period with at least one threshold as follows: when the scaling factor of the sample period has the second value and the auxiliary digital signal of the sample period is positive and above a first threshold, the device is configured to set the scaling factor for the subsequent sample period to the first value; when the scaling factor of the sample period has the first value and the auxiliary digital signal of the sample period is positive and below a second threshold, the device is configured to set the scaling factor for the subsequent sample period to the second value; when the scaling factor of the sample period has the second value and the auxiliary digital signal of the sample period is negative and below a third threshold, the device is configured to set the scaling factor for the subsequent sample period to the first value; when the scaling factor of the sample period has the first value and the auxiliary digital signal of the sample period is negative and above a fourth threshold, the device is configured to set the scaling factor for the subsequent sample period to the second value. In this example, first and second threshold, on the one hand, as well as third and fourth threshold, on the other hand, may coincide or be different, in particular by at least 1% or 5% of the first or the third threshold. E.g., the absolute value of the first and third threshold may be larger than the absolute value of the second and the fourth threshold, respectively. This introduces a feedback loop with hysteresis that increases the stability of the measurement.

In embodiments, the input circuit and the analog end of the ADC are galvanically isolated from the digital end of the ADC, the first signal path, and the second signal path, in particular wherein the ADC is an isolated ADC and the first signal path is separated from the input circuit, e.g., by isolation transformers and/or opto-isolators; the input circuit and/or the analog end of the ADC may use a voltage supply different from the voltage of the digital end of the ADC, the first signal path and/or the second signal path.

The input circuit may comprise one or more resistors and a switch, in particular as a discrete component, the switch being controllable by the scaling signal, wherein the switch may have at least a first state and a second state; the input circuit may be further configured to scale the electrical input signal at least in one of the first and the second state of the switch by a voltage drop across a subset of the one or more resistors; and the scaling factor may have the first value with the switch in the first state and the second value with the switch in the second state, in particular, wherein in the switch is arranged in the input circuit to connect/disconnect and/or shorten at least one of the one or more resistors in the input circuit. In this case, the analog end of the ADC may comprise a first terminal and a second terminal, the input circuit may comprise a first line, connected to the first terminal, and a second line, connected to the second terminal, wherein a series of the switch and the subset of the one or more resistors is connected with the first line and the second line.

In further embodiments, the input circuit and/or the device may be devoid of any amplifier and/or programmable/variable gain amplifier, in particular as a discrete component.

Furthermore, the second signal path may comprise one or more filters adapted to increase the resolution of the refined digital signal.

In embodiments, the scaling factor may not be larger than 1, i.e., it may be 1 or smaller. In other words, the input circuit is configured to attenuate the electrical signal and/or not to amplify the electrical signal.

The device may be a module for analog-to-digital conversion in an intelligent electronic device, in an intelligent electronic device in a substation or power grid automation system, in a process level device, in a merging unit, in a digital relay, or in a phasor measurement unit.

A second aspect of the present invention relates to an intelligent electronic device, an intelligent electronic device in a substation or power grid automation system, a process level device, a merging unit, a digital relay, or a phasor measurement unit comprising a device according to the first aspect of the invention.

A third aspect of the present invention relates to a method for current and/or voltage measurement in an industrial control and automation system, in particular a substation or a power grid automation system. The method can be executed using a device of the first aspect and/or the second aspect of the present invention. The method comprises receiving an, in particular analog, electrical input signal, in particular by an input circuit;

scaling, in particular in the input circuit, the electrical input signal by a scaling factor having at least a first value or a second value;

converting the scaled electrical input signal into an intermediate digital signal, in particular by an Analog-to-Digital Converter, ADC;

creating an auxiliary digital signal from the intermediate digital signal, in particular using the scaling factor, in particular via a first signal path;

setting the scaling factor, in particular for a subsequent clock cycle or sample period, based at least on the auxiliary digital signal, in particular of the sample period or the present sample period.

Herein, the auxiliary digital signal may be created without using a temporal change and/or a slew rate of the intermediate digital signal; e.g., the auxiliary digital signal may not be a predicted or forecasted value for the electrical input signal for a subsequent sample period.

The method may further comprise creating a refined digital signal from the intermediate digital signal using the scaling factor, in particular by a second signal path, wherein creating the auxiliary digital signal is executed faster than creating the refined digital signal, in particular by at least a factor of 2, 5, or 10.

In embodiments, setting the scaling factor may be based on the auxiliary digital signal and on a current value of the scaling factor.

These and other aspects of the present invention will be apparent from and elucidated with reference to the embodiments described hereinafter.

BRIEF DESCRIPTION OF THE DRAWINGS

The subject-matter of the present invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

The present invention will be described in more detail with reference to the drawings, in which exemplary embodiments are shown.

Figure 1:
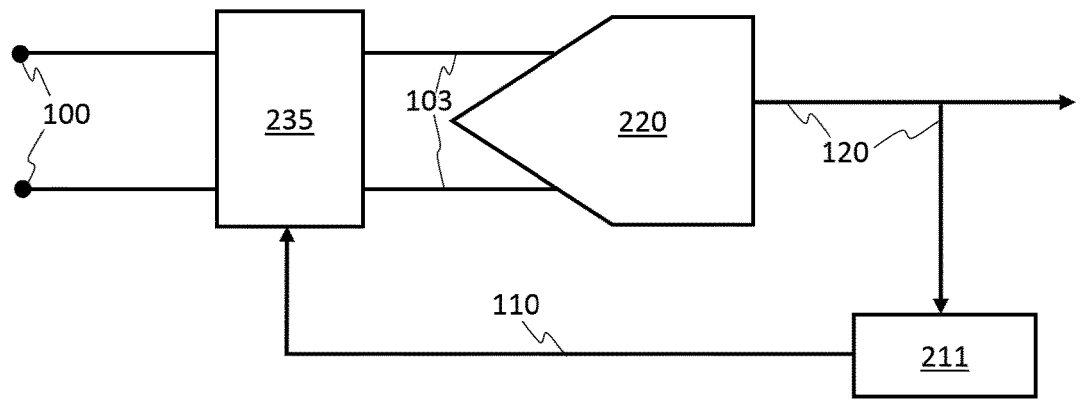
FIG. 1 schematically depicts an embodiment of the first aspect of the present invention.

In FIG. 1, an embodiment of a device according to a first aspect of the present invention is schematically depicted. Here, an input circuit comprises lines and terminals to receive an electrical input signal 100, an attenuator/amplifier 235 adapted to scale the electrical input signal 100 by a scaling factor, and further lines connecting the input circuit to an analog end of an ADC 220 and adapted to guide a scaled electrical input signal 103 to the ADC 220. The electrical input signal can be AC or DC and can be e.g. an electrical input current or an electrical input voltage. In case of an electrical input current, a shunt may be used to convert the current into voltage. The attenuator/amplifier 235 can be any type of electrical or electronic component that is adapted to scale an input electrical signal by a scaling factor and is further adapted to receive a scaling signal to set the scaling factor according to the scaling signal, i.e. is controllable by the scaling signal; the scaling factor can have at least a first and a second value. By way of example, the attenuator/amplifier 235 can be a variable gain amplifier, an assembly comprising one or more element of the group consisting of a switch, a resistor, a gain amplifier, and a transistor. In embodiments, the input circuit and/or the attenuator/amplifier 235 can also be devoid of any amplifier, in particular, any programmable/variable gain amplifier. The ADC 220 converts the scaled electrical signal 103 into an intermediate digital signal 120 that is output at a digital end of the ADC 220. The ADC 220 may be a delta-sigma ADC or any other kind of ADC. A first signal path 211 is connected to the digital end of the ADC 220 to receive the intermediate digital signal 120. In the first signal path 211, an auxiliary digital signal may be created from the intermediate digital signal 120, e.g. by dividing the auxiliary digital signal by the scaling factor, by application of one or more filters, for example to increase the resolution of the auxiliary digital signal, and/or by multiplication with correction, conversion, and/or normalization factors. Hence, the auxiliary digital signal may represent or may be proportional to an estimate of the electrical input signal 100. Based on the auxiliary digital signal of a sample period or clock cycle, e.g., a current sample period or current clock cycle, a scaling signal 110 is created to set the scaling factor for a subsequent sample period or clock cycle. To this end, the scaling signal 110 may be delayed or synchronized. For setting the scaling factor, the auxiliary digital signal may be compared with one or more thresholds. E.g., in case the auxiliary digital signal of the sample period is above a threshold; the scaling factor for the subsequent sample period may be set to a lower value, e.g., to the first value being lower than the second value. In embodiments, the one or more threshold and/or the criteria for comparison may depend on the scaling factor of the sample period or clock cycle. E.g., as an alternative to division of the auxiliary digital signal by the scaling factor, the at least one threshold may be multiplied with the scaling factor. The scaling signal may be sent to the input circuit in any case or only in case of change of the scaling factor. In other words, the first signal path 211 is a feedback loop for the scaling, attenuation, and/or gain of the electrical input signal 100 in the input circuit or the attenuator/amplifier 235. With the at least one threshold depending on the scaling factor of the sample period, a hysteresis in the feedback loop can be achieved that stabilizes the feedback loop as shown further below. Since the auxiliary digital signal does not require a high resolution, i.e., only at maximum a few or even no filters have to be applied to the auxiliary digital signal, and the auxiliary digital signal is not used to calculate a forecasted or a predicted value of the electrical input signal or a slew rate of the electrical input signal 100, the scaling signal 110 can be sent very fast to the input circuit or the attenuator/amplifier 235. In other words, the scaling signal 110 and/or the auxiliary digital signal can be created at a very high sampling rate, e.g., the sampling rate of the first signal path 211, i.e., the first sampling rate, can be between 10 kS/s 100 kS/s to 2000 kS/s, in particular 500 kS/s.

The intermediate digital signal 120 may be used for further processing such as for outputting to a user interface, for creation of time-critical messages and/or sampled value messages, for creation of phasor data, for revenue metering, and/or as input of protection functions. To this end, a refined digital signal 140 may be created from the intermediate digital signal 120 and the scaling factor, e.g., in a second signal path 212 that is connected to the digital end of the ADC 220. Hence, the first signal path 211 may be configured to send the scaling signal 110 or an indication of the scaling factor to the second signal path 212; the second signal path 212 may be configured to receive the scaling signal 110 or the indication of the scaling factor. The refined digital signal 140 may require a higher resolution than the auxiliary digital signal; but may be processed at a lower sampling rate. A typical sampling rate of the second signal path is 1 kS/s to 90 kS/S or 200 kS/s, in particular 20 kS/s; i.e., the first signal path 211 has a sampling rate, i.e., a second sample rate, higher than the sampling rate of the second signal path 212, in particular, by at least a factor of 2 or 10. The first signal path and/or the second signal path can at least partially be realized in a microcontroller, a DSP, a FPGA, and/or an ASIC. The ADC 220, the first signal path 211, and/or the second signal path 212 may be operated in a clocked manner; to this end, they may receive a clock signal; ADC 220, the first signal path 211, and/or the second signal path 212 can be commonly be connected to one clock or be connected to different clocks; i.e., they may have common sample periods or different sample periods.

Figure 2:
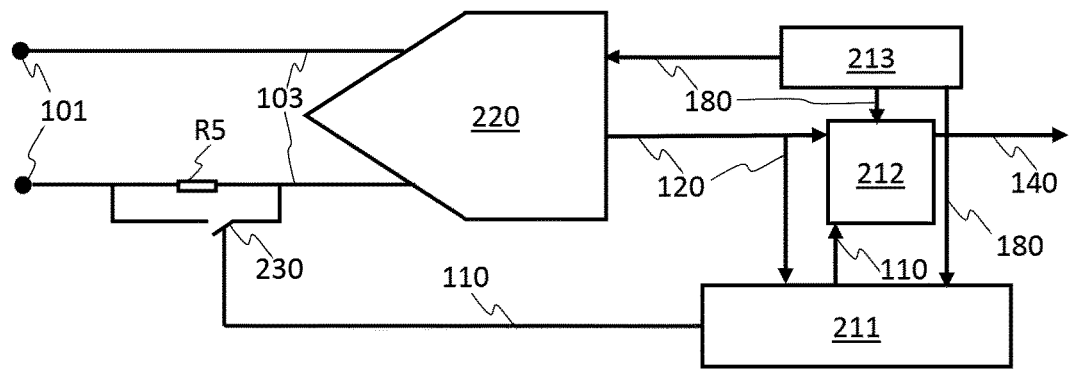
FIG. 2 schematically depicts a further embodiment of the first aspect of the present invention.

FIG. 2 schematically depicts a further embodiment according to the first aspect of the present invention. The input circuit comprises a resistor R5 and a switch 230 that has a first state, i.e., a closed state, and a second state, i.e., an open state, and is controllable by the scaling signal 110. The scaled electrical input signal 103 is scaled by a scaling factor of 1 with the switch 230 in the closed state and is scaled by a scaling factor $R_{ADC}/(R5+R_{ADC})$ in the open state with $R_{ADC}$ being the input resistance of the ADC 220. The device furthermore comprises a clock 213 which is connected to the ADC 220, first signal path 211, and second signal path 212 and sends a clock signal 180 to them.

Figure 3:
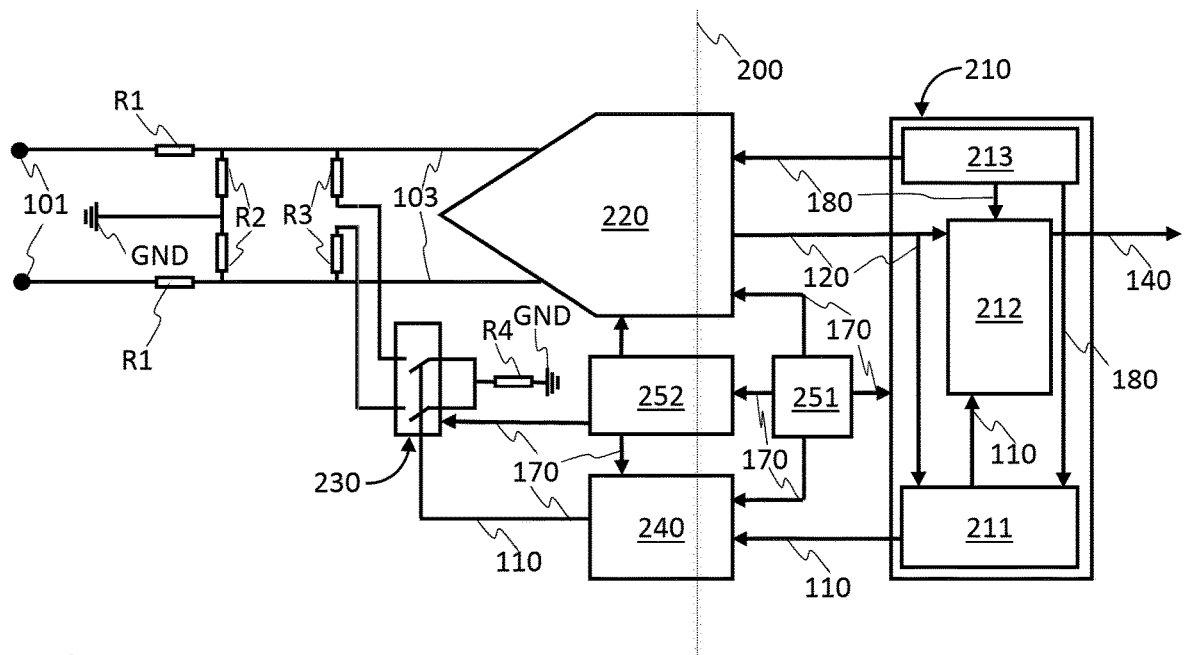
FIG. 3 schematically depicts a further embodiment of the first aspect of the present invention.

FIG. 3 schematically depicts a further embodiment according to the first aspect of the present invention. The input circuit comprises a number of resistors R1, R2, R3, R4 and a number of ground GND contacts. The switch 230 has a first state, i.e., the open state, and a second state, i.e., the closed state, and is controllable by the scaling signal 110. In the open state, the scaled electrical input signal 103 is scaled by a scaling factor of R2/(R1+R2) while in the closed state the scaled electrical input signal 103 is scaled by a scaling factor of R2∥R3/(R1+R2∥R3) with R2∥R3=1/(R2$^{-1}$+R3$^{-1}$). In this embodiment, first signal path 211 and second signal path 212 are realized in a microcontroller 210. The microcontroller 210 comprises a clock 213 that sends a clock signal 180 to the first signal path 211 and the second signal path 212 as well as to the ADC 220. In this embodiment, there is a galvanic isolation, indicated by the isolation barrier 200, between the input circuit, the analog end of the ADC, on the one hand, as well as the first signal path 211, the second signal path 212, and the digital end of the ADC 220. To this end, the embodiment comprises an isolated switch buffer 240, which buffers the scaling signal 110, and an isolated power supply 252. The embodiment furthermore comprises a power supply 251 that provides a supply voltage 170 to a portion of the ADC 220, the microcontroller 210, a portion of the switch buffer 240, and an isolated power supply 252. The isolated power supply 252 provides a supply voltage 170 to a further portion of the switch buffer 240, the switch 230, and a further portion of the ADC 220. The isolation barrier 200 can be achieved by isolation transformers and/or opto-isolators in the isolated power supply 252, the ADC 220, and the switch buffer 240.

Figure 4:
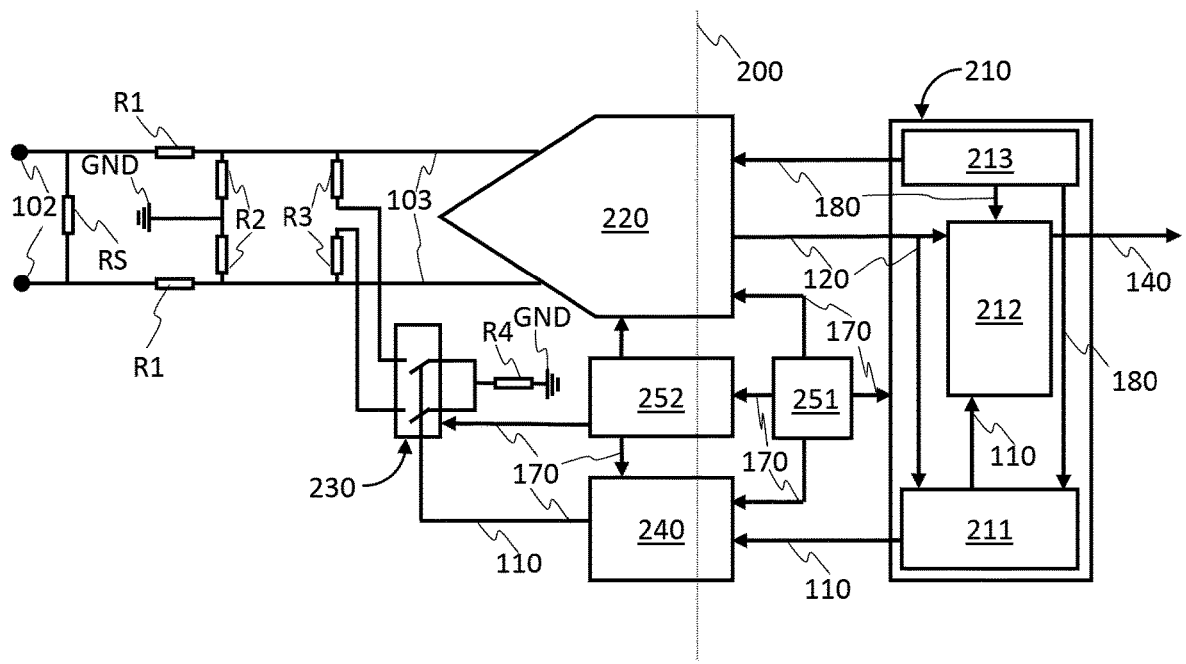
FIG. 4 schematically depicts a further embodiment of the first aspect of the present invention.

FIG. 4 schematically depicts a further embodiment according to the first aspect of the present invention similar to the previously described embodiment. However, the electrical input signal is an electrical input current 102. Hence, the input circuit comprises a shunt RS that converts the current into a voltage; the electrical input signal is then scaled by scaling factor of R2/(R1+R2) in the open state of the switch 230 and by a scaling factor of R2∥R3/(R1+R2∥R3) in the closed state of the switch 230. The resistance of the shunt RS can be applied as a correction factor to the auxiliary digital signal and the refined digital signal to calculate a current signal from the measured voltage.

Regarding all embodiments disclosed above, resistors R1, R2, R3, R4, and/or R5 as well as shunt RS and/or the ADC input resistance $R_{ADC}$ may be ohmic resistors.

Figure 5:
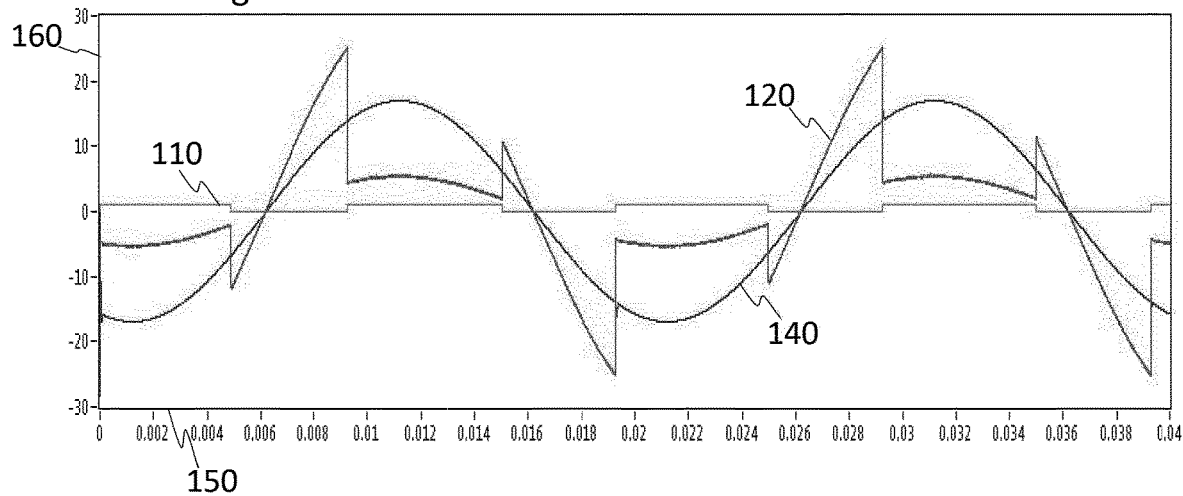
FIG. 5 schematically depicts examples of scaling signal, intermediate digital signal, and refined digital signal as a function of time.

FIG. 5 depicts by way of example, the scaling signal 110, the intermediate digital signal 120, and the refined digital signal 140 as a function of time; the time axis 150 of the graph is given in seconds, while the signal axis 160 is in arbitrary units. The feedback loop given by the first signal path has a hysteresis which results in asymmetric switching behaviour of the scaling factor for falling and rising input signals. This way, a stable switching behaviour can be achieved, even in the presence of electrical noise in the device.

Figure 6:
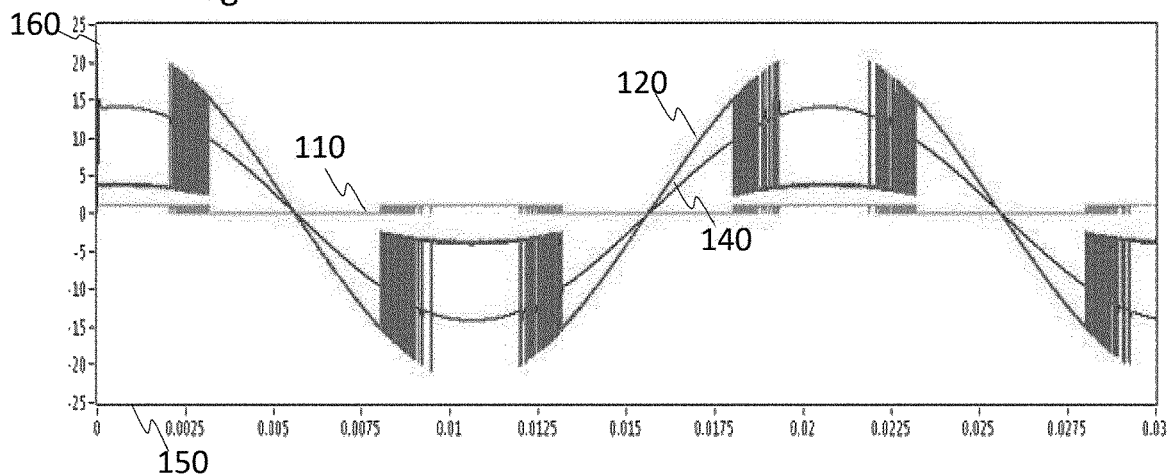
FIG. 6 schematically depicts further examples of scaling signal, intermediate digital signal, and refined digital signal as a function of time.

In contrast, FIG. 6 depicts by way of example, the scaling signal 110, the intermediate digital signal 120 and the refined digital signal 140 as a function of time, wherein the feedback loop given by the first signal path has no hysteresis. Here, the switching behaviour is not stable in the vicinity of the thresholds due to electrical noise in the device.

Figure 7:
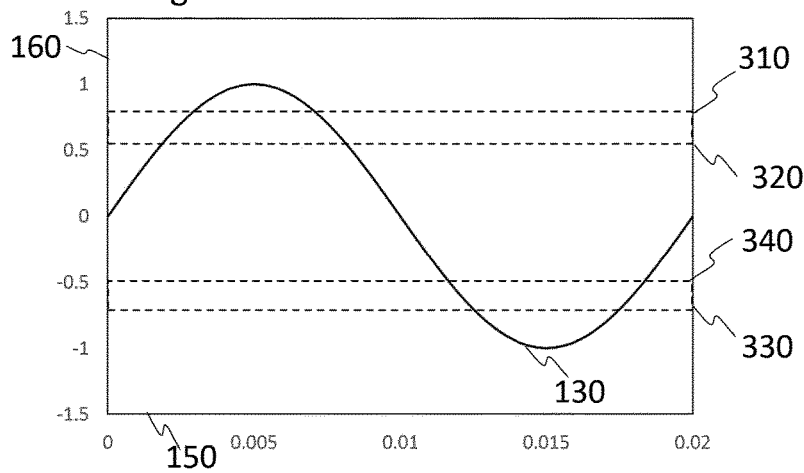
FIG. 7 schematically depicts an example of the auxiliary digital signal as a function of time with first, second, third, and fourth threshold.

For further illustration, FIG. 7 depicts by way of example, the electrical input signal 130 as a function of time with the dashed lines indicating a first threshold 310, a second threshold 320, a third threshold 330, and a fourth threshold 340 wherein the absolute value of the first threshold 310 is larger than the absolute value of the second threshold 320 and the absolute value of the third threshold 330 is larger than the absolute value of the fourth threshold 340. In this example, the scaling factor may have at least a first value or a second value with the second value being larger than the first value and the device may be configured to conduct the comparison of the auxiliary digital signal of the sample period with at least one threshold 310, 320, 330, 340 as follows: when the scaling factor of the sample period has the second value and the auxiliary digital signal 130 of the sample period is positive and above the first threshold 310, the device is configured to set the scaling factor for the subsequent sample period to the first value; when the scaling factor of the sample period has the first value and the auxiliary digital signal 130 of the sample period is positive and below a second threshold 320, the device is configured to set the scaling factor for the subsequent sample period to the second value; when the scaling factor of the sample period has the second value and the auxiliary digital signal 130 of the sample period is negative and below a third threshold 330, the device is configured to set the scaling factor for the subsequent sample period to the first value; when the scaling factor of the sample period has the first value and the auxiliary digital signal 130 of the sample period is negative and above a fourth threshold 340, the device is configured to set the scaling factor for the subsequent sample period to the second value. In this example, first 310 and second threshold 320, on the one hand, as well as third 330 and fourth threshold 340, on the other hand, are different, in particular by at least 1% or 5% of the first or the third threshold, respectively. This way, zones of no switching of the scaling factor are formed for signals between first 310 and second threshold 320 as well as between third 330 and fourth threshold 340, introducing a hysteresis feedback that prevents instable switching behaviour as illustrated in FIG. 6.

While the invention has been described in detail in the drawings and foregoing description, such description is to be considered illustrative or exemplary and not restrictive. Variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage, specifically, in addition to the actual claim dependency, any further meaningful claim combination shall be considered disclosed.

LIST OF REFERENCE SYMBOLS 100 electrical input signal
101 electrical input voltage
102 electrical input current
103 scaled electrical input signal
R1, R2, R3, R4, R5 resistors GND ground
110 scaling signal
120 intermediate digital signal
130 auxiliary digital signal
140 refined digital signal
150 time axis in seconds
160 signal axis in arbitrary units
170 supply voltage
180 clock signal
200 isolation barrier
210 microcontroller
211 first signal path
212 second signal path
213 clock
220 ADC
230 switch
RS shunt
235 attenuator/amplifier
240 switch buffers
251 power supply
252 isolated power supply
310 first threshold
320 second threshold
330 third threshold
340 fourth threshold

The invention claimed is:

1. A device for current and/or voltage measurement in an industrial and automation control system, a substation automation system, or power grid automation system, the device comprising:
an input circuit configured to receive an electrical input signal, to scale the electrical input signal by a scaling factor, to receive a scaling signal, and to set the scaling factor according to the scaling signal to at least a first or a second value;
an Analog-to-Digital Converter (ADC) having an analog end electrically connected to the input circuit, and a digital end, wherein the ADC is configured to convert the scaled electrical input signal into an intermediate digital signal and to output the intermediate digital signal at the digital end;
a first signal path connected to the digital end of the ADC and configured to create the scaling signal and to send the scaling signal to the input circuit; and
a second signal path connected to the digital end of the ADC and configured to create a refined digital signal from the intermediate digital signal using the scaling factor;
wherein the device is configured to set, based on the intermediate digital signal of a sample period and the scaling factor of the sample period, the scaling factor for a subsequent sample period;
wherein the second signal path has a second sampling rate and the first signal path has a first sampling rate higher than the second sampling rate;
wherein the input circuit comprises one or more resistors and a switch controllable by the scaling signal, wherein the switch has at least a first state and a second state;
wherein the input circuit is further configured to scale the electrical input signal at least in one of the first and the second state of the switch by a voltage drop across a subset of the one or more resistors;
wherein the scaling factor has the first value with the switch in the first state and the second value with the switch in the second state;
wherein the analog end of the ADC comprises a first terminal and a second terminal;
wherein the input circuit comprises a first line, connected to the first terminal, and a second line, connected to the second terminal; and
wherein a series of the switch and the subset of the one or more resistors is connected with the first line and the second line.

2. The device of claim 1, wherein the input circuit and the analog end of the ADC are galvanically isolated from the digital end of the ADC, the first signal path, and the second signal path.

3. The device of claim 1, wherein the second signal path comprises one or more filters adapted to increase the resolution of the refined digital signal.

4. The device of claim 1, wherein the ADC is a delta-sigma ADC.

5. The device of claim 1, wherein the scaling factor is 1 or smaller.

6. The device of claim 1, wherein the device is a module for analog-to-digital conversion in an intelligent electronic device, in an intelligent electronic device in a substation or power grid automation system, in a process level device, or in a merging unit.

7. An intelligent electronic device, an intelligent electronic device in a substation or power grid automation system, a process level device, a merging unit, a digital relay, or a phasor measurement unit comprising a device according to claim 1.

8. The device of claim 1, wherein the first signal path is further configured to create an auxiliary digital signal from the intermediate digital signal and wherein the device is configured to set the scaling factor for the subsequent sample period by comparing the auxiliary digital signal of the sample period with at least one threshold.

9. The device of claim 8, wherein the at least one threshold depends on the scaling factor of the sample period.

10. A device for current and/or voltage measurement in an industrial and automation control system, a substation automation system, or power grid automation system, the device comprising:
an input circuit configured to receive an electrical input signal, to scale the electrical input signal by a scaling factor, to receive a scaling signal, and to set the scaling factor according to the scaling signal to at least a first or a second value;
an Analog-to-Digital Converter (ADC) having an analog end electrically connected to the input circuit, and a digital end, wherein the ADC is configured to convert the scaled electrical input signal into an intermediate digital signal and to output the intermediate digital signal at the digital end;
a first signal path connected to the digital end of the ADC and configured to create the scaling signal and to send the scaling signal to the input circuit; and
a second signal path connected to the digital end of the ADC and configured to create a refined digital signal from the intermediate digital signal using the scaling factor;
wherein the device is configured to set, based on the intermediate digital signal of a sample period and the scaling factor of the sample period, the scaling factor for a subsequent sample period;
wherein the second signal path has a second sampling rate and the first signal path has a first sampling rate higher than the second sampling rate; and
wherein the first signal path is further configured to create an auxiliary digital signal from the intermediate digital signal and wherein the device is configured to set the scaling factor for the subsequent sample period by comparing the auxiliary digital signal of the sample period with at least one threshold.

11. The device of claim 10, wherein the at least one threshold depends on the scaling factor of the sample period.

12. The device of claim 10, wherein the input circuit and the analog end of the ADC are galvanically isolated from the digital end of the ADC, the first signal path, and the second signal path.

13. The device of claim 10, wherein:
the input circuit comprises one or more resistors and a switch controllable by the scaling signal, wherein the switch has at least a first state and a second state;
the input circuit is further configured to scale the electrical input signal at least in one of the first and the second state of the switch by a voltage drop across a subset of the one or more resistors; and
the scaling factor has the first value with the switch in the first state and the second value with the switch in the second state.

14. The device of claim 10, wherein the second signal path comprises one or more filters adapted to increase the resolution of the refined digital signal.

15. The device of claim 10, wherein the ADC is a delta-sigma ADC.

16. The device of claim 10, wherein the scaling factor is 1 or smaller.

17. The device of claim 10, wherein the device is a module for analog-to-digital conversion in an intelligent electronic device, in an intelligent electronic device in a substation or power grid automation system, in a process level device, or in a merging unit.

18. An intelligent electronic device, an intelligent electronic device in a substation or power grid automation system, a process level device, a merging unit, a digital relay, or a phasor measurement unit comprising a device according to claim 10.

19. A method for current and/or voltage measurement in an industrial control and automation system, a substation automation system, or a power grid automation system, the method comprising:
receiving an electrical input signal;
scaling the electrical input signal by a scaling factor having at least a first value or a second value;
converting the scaled electrical input signal into an intermediate digital signal;
creating an auxiliary digital signal from the intermediate digital signal;
creating a refined digital signal from the intermediate digital signal using the scaling factor, wherein creating the auxiliary digital signal is executed faster than creating the refined digital signal; and
setting the scaling factor based at least on the auxiliary digital signal.

20. The method of claim 19, wherein setting the scaling factor is based on the auxiliary digital signal and on a current value of the scaling factor.

* * * * *